(12) United States Patent
Harney et al.

(10) Patent No.: US 6,768,196 B2
(45) Date of Patent: Jul. 27, 2004

(54) PACKAGED MICROCHIP WITH ISOLATION

(75) Inventors: Kieran Harney, Andover, MA (US); Lewis Long, Woburn, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/234,215

(22) Filed: Sep. 4, 2002

(65) Prior Publication Data

US 2004/0041248 A1 Mar. 4, 2004

(51) Int. Cl.[7] .............................. H01L 23/06; H05K 7/06
(52) U.S. Cl. ..................... 257/729; 257/773; 257/783; 361/757; 361/758; 361/807
(58) Field of Search ............................... 257/704, 729, 257/747, 773, 782, 783; 438/106, 118, 121, 125; 361/752, 757, 758, 807, 809

(56) References Cited

U.S. PATENT DOCUMENTS

| | | | |
|---|---|---|---|
| 4,710,744 A | 12/1987 | Wamstad | 338/4 |
| 4,740,410 A | 4/1988 | Muller et al. | 428/133 |
| 4,800,758 A | 1/1989 | Knecht et al. | 73/727 |
| 4,872,047 A | 10/1989 | Fister et al. | 357/67 |
| 4,918,032 A | 4/1990 | Jain et al. | 437/228 |
| 4,948,757 A | 8/1990 | Jain et al. | 437/240 |
| 5,105,258 A | * 4/1992 | Silvis et al. | 257/748 |
| 5,207,102 A | 5/1993 | Takahashi et al. | 73/727 |
| 5,273,939 A | 12/1993 | Becker et al. | 437/209 |
| 5,315,155 A | 5/1994 | O'Donnelly et al. | 257/711 |
| 5,336,928 A | * 8/1994 | Neugebauer, deceased et al. | 257/758 |
| 5,468,999 A | * 11/1995 | Lin et al. | 257/784 |
| 5,515,732 A | 5/1996 | Willcox et al. | 73/724 |
| 5,945,605 A | 8/1999 | Julian et al. | 73/727 |

OTHER PUBLICATIONS

The Electronic Packaging Handbook, CRC Press LLC, pp. 2–3, 7–1, 7–3, 7–12, A–9, and A–11, 2000.
Advanced Electronic Packaging With Emphasis on Multi-chip Modules, Institute of Electrical and Electronics Engineers, Inc., pp. 4, 8, 568, 1999.
Microelectronics Packaging Handbook Semiconductor Packaging Part II, Second Edition, Chapman & Hall, pp. 11–12, 1997.
Handbook of Electronic Package Design, Marcel Dekker, Inc., pp. 173, 179, 196, 210, 736, 744, 821, and 832, 1991.
Mikromechanik, Springer Verlang A.G., pp. 470–476, 1989, With translation.

* cited by examiner

*Primary Examiner*—Alonzo Chambliss
(74) *Attorney, Agent, or Firm*—Bromberg & Sunstein LLP

(57) ABSTRACT

A packaged microchip has a stress sensitive microchip having a microchip coefficient of thermal expansion, a package having a package coefficient of thermal expansion, and an isolator having an isolator coefficient of thermal expansion. The isolator is connected between the stress sensitive microchip and the package. The microchip coefficient of thermal expansion illustratively is closer to the isolator coefficient of thermal expansion than it is to the package coefficient of thermal expansion.

19 Claims, 3 Drawing Sheets

PACKAGED MICROCHIP WITH ISOLATION

FIELD OF THE INVENTION

The invention generally relates microchips and, more particularly, the invention relates packaging techniques for microchips

BACKGROUND OF THE INVENTION

Microelectromechanical systems ("MEMS") are used in a growing number of applications. For example, MEMS currently are implemented as gyroscopes to detect pitch angles of airplanes, and as accelerometers to selectively deploy air bags in automobiles. In simplified terms, such MEMS devices typically have a structure suspended above a substrate, and associated electronics that both senses movement of the suspended structure and delivers the sensed movement data to one or more external devices (e.g., an external computer). The external device processes the sensed data to calculate the property being measured (e.g., pitch angle or acceleration).

The associated electronics, substrate, and movable structure typically are formed on one or more dies (referred to herein simply as a "die") that are secured within a package. For example, the package, which typically hermetically seals the die, may be produced from ceramic or plastic. The package includes interconnects that permit the electronics to transmit the movement data to the external devices. To secure the die to the package interior, the bottom surface of the die commonly is bonded (e.g., with an adhesive or solder) to an internal surface (e.g., a die attach pad) of the package. Accordingly, substantially all of the area of the bottom die surface is bonded to the internal surface the package.

Problems can arise, however, when the temperatures of the two surfaces change. In particular, because both surfaces typically have different coefficients of thermal expansion, the package can apply a mechanical stress to the substrate of the die. This stress (referred to in the art as "linear stress," which, in this case, is thermally induced) undesirably can bend or flex the substrate to an unknown curvature. Substrate bending or flexing consequently can affect movement of the die structures and the functioning of the electronics, thus causing the output data representing the property being measured (e.g., acceleration) to be erroneous. In a similar manner, mechanically induced linear or torsional stress applied to the package also can be translated to the die, thus causing the same undesirable effects.

SUMMARY OF THE INVENTION

In accordance with one aspect of the invention, a packaged microchip has a stress sensitive microchip having a microchip coefficient of thermal expansion, a package having a package coefficient of thermal expansion, and an isolator having an isolator coefficient of thermal expansion. The isolator is connected between the stress sensitive microchip and the package. In accordance with illustrative embodiments, the microchip coefficient of thermal expansion is closer to the isolator coefficient of thermal expansion than it is to the package coefficient of thermal expansion.

In some embodiments, the difference between the microchip coefficient of thermal expansion and the isolator coefficient of thermal expansion is smaller than the difference between the microchip coefficient of thermal expansion and the package coefficient of thermal expansion. Moreover, the stress sensitive microchip may be a MEMS device, where the stress sensitive microchip includes a movable structure suspended above a substrate having a substrate coefficient of thermal expansion. In such case, the microchip coefficient of thermal expansion may be a function of the substrate coefficient of thermal expansion.

The stress sensitive microchip illustratively has a microchip surface, while the isolator also has an isolator surface. The isolator surface may both face and be connected to the microchip surface. The isolator surface illustratively is connected to no more than a portion of the microchip surface. In other embodiments, the package has a package surface, and a portion of the package surface is connected the isolator. The package surface area is greater than the isolator surface area. Among other materials, the package comprises a ceramic material. The packaged microchip also may include a stress absorbing material that secures the isolator to the package.

In accordance with another aspect of the invention, a sensor has a die comprising a movable structure suspended from a substrate having a substrate coefficient of thermal expansion, an isolator having an isolator coefficient of thermal expansion, and a package forming an inner cavity that contains the die. The package also has a package coefficient of thermal expansion The isolator is connected between the substrate and the package. The substrate coefficient of thermal expansion illustratively is closer to the isolator coefficient of thermal expansion than it is to the package coefficient of thermal expansion.

In some embodiments, the sensor also has a lid that is secured to the package. The lid encloses the inner cavity. The sensor also may include a stress absorbing material that secures the isolator to the package. Moreover, the inner cavity of the package may have a cavity surface, while the substrate may have a substrate surface. The isolator thus forms a space between a portion of the substrate surface and a portion of the cavity surface. Among other things, the die may be one of a gyroscope, an accelerometer, or other type of MEMS device.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments of the invention, a packaged microchip (e.g., a microelectromechanical system, also referred to herein as a "MEMS") includes an isolator that secures a microchip within the interior of a package. The material and dimensions of the isolator are selected to minimize microchip stress (e.g., linear stress and torsional stress) caused by the package. Details of this and other embodiments are discussed below.

Figure 1:
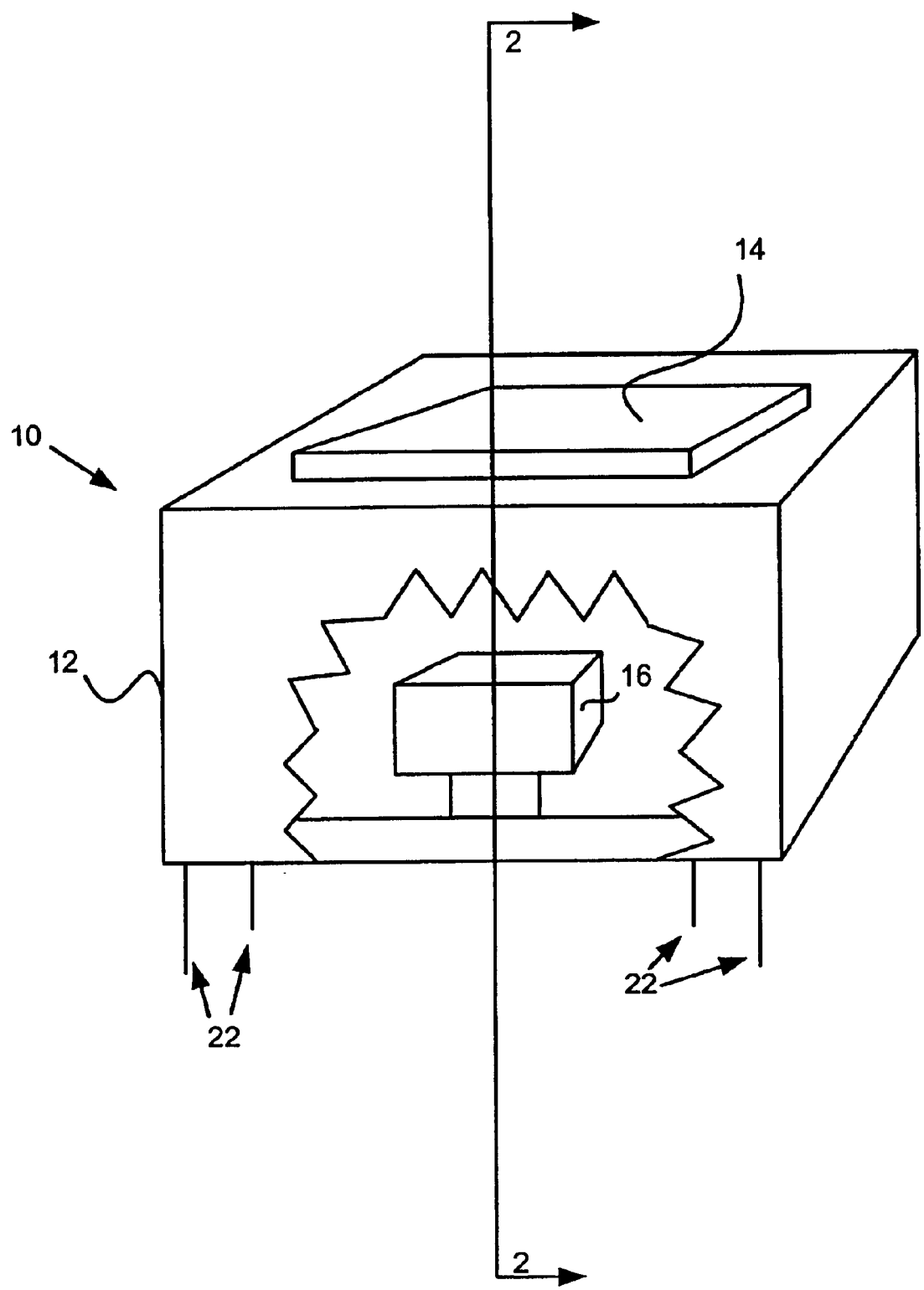
FIG. 1 schematically shows a partially cut-away view of a packaged microchip that may be produced in accordance with illustrative embodiments of the invention.

FIG. 1 schematically shows a partially cut-away isometric view of a packaged microchip 10 that can implement various embodiments of the invention. In illustrative embodiments, the packaged microchip 10 is a MEMS device implemented as a gyroscope. Accordingly, for illustrative purposes, various embodiments are discussed herein as a MEMS gyroscope. The MEMS device shown in FIGS. 1 and 2 thus are identified as gyroscope 10. It should be noted, however, that discussion of various embodiments as a MEMS gyroscope is exemplary only and thus, not intended to limit all embodiments of the invention. Accordingly, some embodiments may apply to other types of microchip devices, such as integrated circuits. In addition, embodiments of the invention can be applied to other types of MEMS devices, such as MEMS-based optical switching devices and MEMS-based accelerometers. In addition, embodiments of the invention can be applied to microchip devices mounted in packages that are not hermetically sealed, such as cavity plastic packages and the like.

The gyroscope 10 shown in FIG. 1 includes a conventional package 12, a lid 14 to hermetically seal the package 12, and a conventional gyroscope die 16 secured within the sealed interior 32. The gyroscope die 16 includes the well known mechanical structure and electronics (discussed below with regard to FIG. 2) that measure angular position relative to a given axis. A plurality of pins 22 extending from the package 12 electrically connect with the gyroscope die 16 to permit electrical communication between the gyroscope electronics and an exterior device (e.g., a computer).

Figure 2:
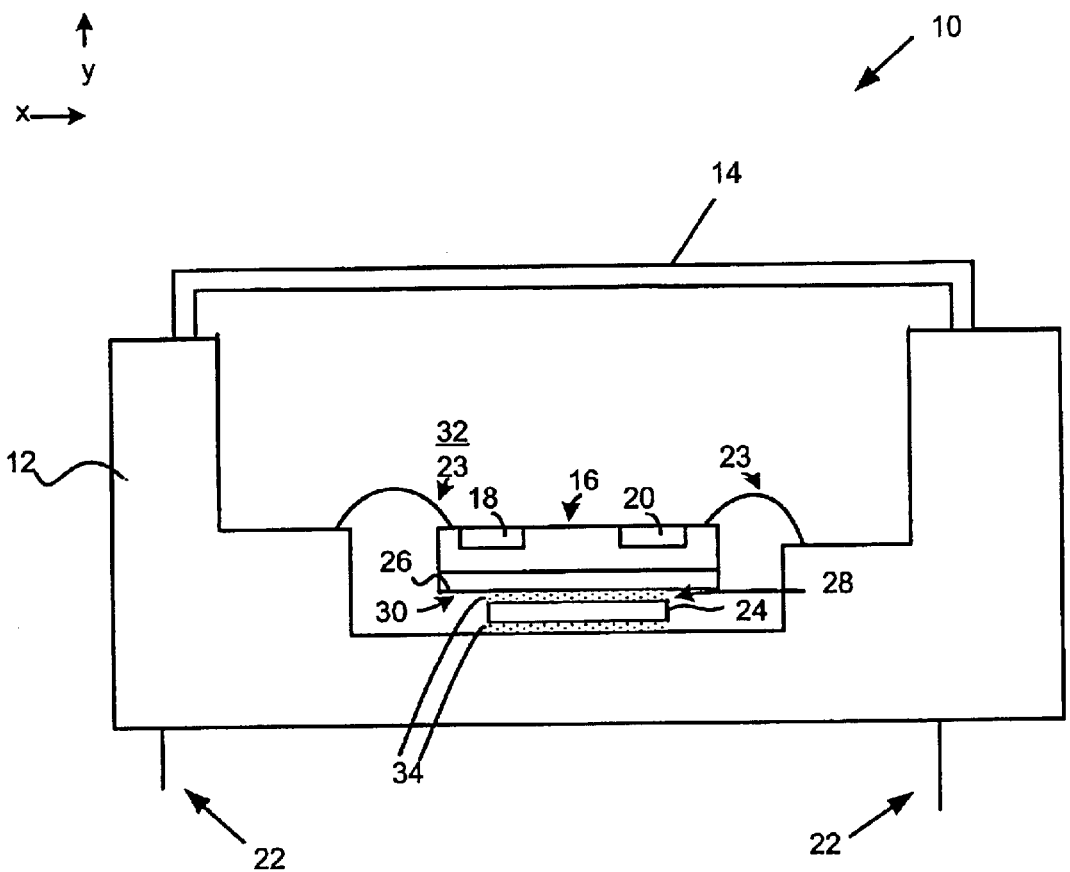
FIG. 2 schematically shows a cross-sectional view of the packaged microchip shown in FIG. 1 along line 2—2.

Rather than being directly bonded to the interior surface of the package 12, the gyroscope die 16 is bonded to an isolator 24, which itself is bonded to the interior 32 of the package 12. More specifically, FIG. 2 schematically shows a cross-sectional view of the packaged microchip 10 shown in FIG. 1 along line 2—2. This view clearly shows the package 12 and its corresponding lid 14, the die 16, and the isolator 24.

As noted above, the die 16 includes conventional silicon MEMS structure 18 to mechanically sense angular rotation, and accompanying electronics 20. Such structure 18 and electronics 20 (both shown schematically in FIG. 2) illustratively are formed on a silicon-on-insulator wafer, which has an oxide layer between a pair of silicon layers. As an example, among other things, the MEMS structure 18 may include one or more vibrating masses suspended above a silicon substrate 26 by a plurality of flexures. The structure 18 also may include a comb drive and sensing apparatus to both drive the vibrating masses and sense their motion. Accordingly, the electronics 20 may include, among other things, the driving and sensing electronics that couple with the comb drive and sensing apparatus, and signal transmission circuitry. Wires 23 electrically connect the accompanying electronics 20 with the pins 22. Exemplary MEMS gyroscopes are discussed in greater detail in co-pending provisional U.S. patent applications identified by serial Nos. 60/364,322 and 60/354,610, both of which are assigned to Analog Devices, Inc. of Norwood, Mass. The disclosures of both of the noted provisional patents are incorporated herein, in their entireties, by reference.

In alternative embodiments, the MEMS structure 18 and accompanying electronics 20 are on different dies. For example, the die 16 having the MEMS structure 18 may be mounted to the package 12 by a first isolator 24, while the die 16 having the accompanying electronics 20 may be mounted to the package 12 by a second isolator 24. Alternatively, both dies may be mounted to the same isolator 24. In some cases, one of the dies 16 (i.e., a stress sensitive die 16) may be mounted on the isolator 24, while the other die 16 (i.e., a non-stress sensitive die 16) may be mounted directly to the package 12. It should be noted, however, that principles of illustrative embodiments apply to such embodiments.

The die 16, which is a microchip and/or integrated circuit, is sensitive to both linear and torsional stress. In this context, the term "sensitive" generally means that the operation of the structure 18 and/or electronics 20 on the die 16 can be compromised when subjected to stress. For example, as suggested above, stress applied to the die 16 can cause the flexures suspending the mass to bend or compress. As a consequence, the mass may not vibrate at a prescribed rate and angle, thus producing a quadrature problem. As a further example, the comb drive may become misaligned, or the electronics 20 may become damaged. Any of these exemplary problems undesirably can corrupt the resulting data produced by the MEMS die 16. Accordingly, for these reasons, the die 16 or other microchip may be referred to as being "stress sensitive."

To solve these stress related problems, the isolator 24 is from a material having a coefficient of thermal expansion that more closely matches that of the die 16 than that of the package 12. In other words, the coefficient of thermal expansion of the isolator 24 should be closer to that of the die substrate 26 than that of the package 12. In illustrative embodiments, the package 12 is formed from a ceramic material, such as aluminum oxide ($Al_2O_3$), which generally has a coefficient of thermal expansion of about 7 ppm per degree Celcius. Moreover, in illustrative embodiments, the substrate 26 is silicon, which generally has a coefficient of thermal expansion of about 4 ppm per degree Celcius. Accordingly, in illustrative embodiments, the coefficient of thermal expansion of the isolator 24 is closer to 4 than it is to 7. To that end, the isolator 24 illustratively is formed from silicon, which exactly matches the material of the substrate 26. The isolator 24 thus has a coefficient of thermal expansion of about 4. Consequently, both the isolator 24 and substrate 26 should expand and contract at substantially the same rate in response to temperature changes. In alternative embodiments, the isolator 24 is formed from a material other than silicon. Such material, however, illustratively has a coefficient of thermal expansion that is closer to that of the substrate 26 than that of the package 12.

Although it provides these beneficial results, the isolator 24 nevertheless still contacts the aluminum oxide package 12 and thus, is subjected to the above noted linear stress. The isolator 24 attenuates such stress, however, to a level that should have a minimal impact on the die performance.

In addition to matching the die 16 and isolator 24 materials, in illustrative embodiments, the isolator 24 also is sized to minimize the impact of torsional stress. To that end, the bonding surfaces of the isolator 24 and the die 16 are sized to minimize contact. More specifically, the isolator 24 has a top surface 28 that is bonded to the bottom surface 30 of the die 16. The isolator top surface 28 has a surface area that is smaller than that of the bottom surface 30 of the die 16, thus forming a space between the die bottom surface 30 and the package 12. Accordingly, a relatively large portion of the die bottom surface 30 is not subjected to direct torsional stress produced by the package 12. In a manner similar to the process of matching materials based on their coefficients of thermal expansion, this process of selecting the relative sizes of the isolator 24 and die 16 also is referred to herein as "matching."

Exemplary dimensions of the various components of the packaged die 16 thus follow. Note that on FIG. 2, the X direction indicates length, the Y direction indicates height (thickness), and the Z direction (i.e., not shown but perpendicular to the X and Y directions) indicates width.

Package 12: Height: 0.12 inches;
Die 16: Length: 0.170 inches; Width: 0.140 inches; Height: 0.027 inches;
Isolator 24: Length: 0.084 inches; Width: 0.084 inches; Height: 0.026 inches.

A packaged microchip having these relative dimensions should perform satisfactorily for the purposes described herein. Of course, these dimensions are for illustration only. Other embodiments thus are not limited to these specific dimensions. Accordingly, a packaged microchip 10 having an isolator 24, package 12, and die 16 with different dimensions, within the above noted constraints, should provide a corresponding stress attenuation. In some embodiments, the materials are not matched, while the relative isolator 24/die 16 sizes are matched as discussed above. In other embodiments, the materials are matched, while the relative isolator 24/die 16 sizes are not matched as discussed above.

In illustrative embodiments, the isolator 24 is a silicon wafer that is bonded to both the die bottom surface 30 and package interior surface by means of an adhesive 34. Such adhesive 34 preferably also has stress absorbing properties, thus further attenuating the noted stresses. In exemplary embodiments, the adhesive 34 is a silver filled glass adhesive material, such as Dexter product code number QMI3555, distributed by Dexter Electronic Materials of San Diego, Calif. Dexter Electronic Materials is a division of Loctite Corporation of Germany.

Other types of material may be used to bond the isolator 24 to the die 16 and the package 12. Such materials include other silver glass materials, epoxies, cynate esters, and silicone. Although desirable, in various embodiments, it is not necessary that these bonding agents have stress absorbing properties. In addition, other conventional means may be used to connect the isolator 24 to both the die 16 and the package 12. Accordingly, discussion of adhesive 34 is exemplary and not intended to limit the scope of various embodiments of the invention.

In alternative embodiments, the isolator 24 is integral with the die 16 and thus, the same material. In other embodiments, the isolator 24 is integral with the package 12 (i.e., the isolator 24 is incorporated into the package 12). In such embodiments, the isolator 24 and package 12 may be produced from a material having a coefficient of thermal expansion that is relatively close to that of the die 16. For example, the package 12 may be manufactured from aluminum nitride (AlN).

Figure 3:
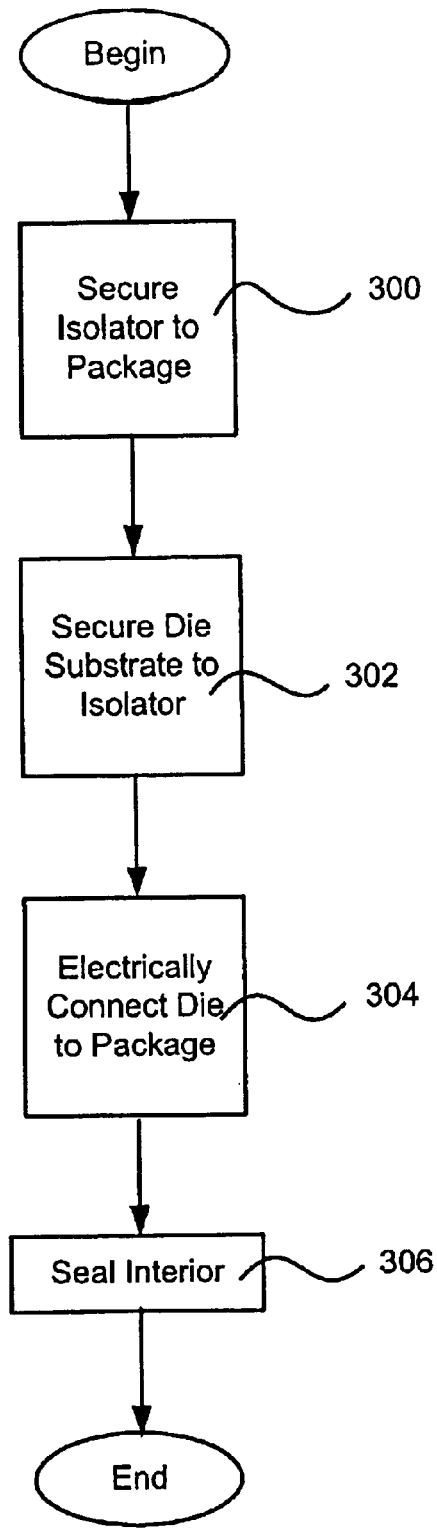
FIG. 3 shows a process of producing the packaged microchip shown in FIGS. 1 and 2.

FIG. 3 shows an exemplary process of assembling the packaged microchip 10 shown in FIGS. 1 and 2. The process begins at step 300, in which an adhesive 34 bonds the isolator 24 to an interior surface of the package 12. As known by those skilled in the art, this interior surface typically is referred to as a "die attach pad." The process then continues to step 302, in which the bottom surface 30 of the substrate 26 is bonded to the top surface 28 of the isolator 24. The die 16 then is electrically interconnected to the package 12 (step 304). Next, at step 306, the lid 14 is secured to the top of the package 12, thus sealing the interior 32. If desired, a gas may be injected into the package interior 32 before the lid 14 is secured to the package 12.

In alternative embodiments, steps 300 and 302 are performed in the opposite order. In other words, in such embodiments, the isolator 24 first is bonded to the substrate 26, and then the isolator 24 (with attached substrate 26) is bonded to the interior 32 of the package 12.

Although various exemplary embodiments of the invention are disclosed below, it should be apparent to those skilled in the art that various changes and modifications can be made that will achieve some of the advantages of the invention without departing from the true scope of the invention.

What is claimed is:

1. A packaged microchip comprising:
   a stress sensitive microchip having a microchip coefficient of thermal expansion;
   a package having a package coefficient of thermal expansion; and
   an isolator having an isolator coefficient of thermal expansion, the isolator being connected between the stress sensitive microchip and the package,
   the microchip coefficient of thermal expansion being closer to the isolator coefficient of thermal expansion than it is to the package coefficient of thermal expansion,
   wherein the stress sensitive microchip has a bottom microchip surface, the isolator also having an isolator surface that both faces and is connected to the bottom microchip surface, the isolator surface having a surface area that is smaller than the area of the bottom microchip surface, the isolator forming a space between at least a portion of the bottom microchip surface and the package, the space being free of the isolator.

2. The packaged microchip as defined by claim 1 wherein the difference between the microchip coefficient of thermal expansion and the isolator coefficient of thermal expansion is smaller than the difference between the microchip coefficient of thermal expansion and the package coefficient of thermal expansion.

3. The packaged microchip as defined by claim 1 wherein the stress sensitive microchip is a MEMS device.

4. The packaged microchip as defined by claim 3 wherein the stress sensitive microchip includes a movable structure suspended above a substrate.

5. The packaged microchip as defined by claim 4 wherein the substrate has a substrate coefficient of thermal expansion, the microchip coefficient of thermal expansion being a function of the substrate coefficient of thermal expansion.

6. The packaged microchip as defined by claim 1 wherein the package has a package surface, a portion of the package surface being connected the isolator, the package surface area being greater than the isolator surface area.

7. The packaged microchip as defined by claim 1 wherein the package comprises a ceramic material.

8. The packaged microchip as defined by claim 1 further including a stress absorbing material that secures the isolator to the package.

9. The packaged microchip as defined by claim 1 wherein a first adhesive connects the isolator to the stress sensitive microchip.

10. The packaged microchip as defined by claim 9 wherein a second adhesive connects the isolator to the package.

11. A sensor comprising:
    a die comprising a movable structure suspended from a substrate, the substrate having a substrate coefficient of thermal expansion;
    an isolator having an isolator coefficient of thermal expansion; and a package forming an inner cavity that contains the die, the package having a package coefficient of thermal expansion, the isolator being connected between the substrate and the package, the substrate coefficient of thermal expansion being closer to the isolator coefficient of thermal expansion than it is to the package coefficient of thermal expansion, wherein the substrate has a bottom substrate surface, the isolator forming a space between at least a portion of the bottom substrate surface and the package, the space being free of the isolator.

12. The sensor as defined by claim 11 further comprising:

a lid secured to the package, the lid enclosing the inner cavity.

13. The sensor as defined by claim 11 wherein the die is one of a gyroscope and an accelerometer.

14. The sensor as defined by claim 11 further including a stress absorbing material that secures the isolator to the package.

15. The sensor as defined by claim 11 wherein the package comprises a ceramic material.

16. A packaged microchip comprising:

a stress sensitive microchip having a microchip coefficient of thermal expansion;

means for packaging the stress sensitive microchip, the packaging means having a package coefficient of thermal expansion; and means for securing the stress sensitive microchip to the packaging means, the securing means having a securing coefficient of thermal expansion, the microchip coefficient of thermal expansion being closer to the securing coefficient of thermal expansion than it is to the package coefficient of thermal expansion, wherein the microchip has a bottom surface, the securing means forming a space between at least a portion of the bottom surface of the stress sensitive microchip and the packaging means, the space being free of the securing means.

17. The packaged microchip as defined by claim 16 wherein the packaging means includes a ceramic package.

18. The packaged microchip as defined by claim 16 further including a stress absorbing material that secures the securing means to the packaging means.

19. The packaged microchip as defined by claim 16 wherein the stress sensitive microchip includes a movable structure suspended above a substrate.

* * * * *